United States Patent
Denifl et al.

(10) Patent No.: US 9,511,560 B2
(45) Date of Patent: Dec. 6, 2016

(54) PROCESSING A SACRIFICIAL MATERIAL DURING MANUFACTURE OF A MICROFABRICATED PRODUCT

(75) Inventors: Guenter Denifl, Annenheim (AT); Daniel Maurer, Feld am See (AT); Thomas Grille, Villach (AT); Joachim Hirschler, Villach (AT); Markus Kahn, Rangersdorf (AT)

(73) Assignee: Infineon Technologies AG, Neubiberg (DE)

( * ) Notice: Subject to any disclaimer, the term of this patent is extended or adjusted under 35 U.S.C. 154(b) by 284 days.

(21) Appl. No.: 13/446,159

(22) Filed: Apr. 13, 2012

(65) Prior Publication Data
US 2013/0273326 A1 Oct. 17, 2013

(51) Int. Cl.
*B32B 1/00* (2006.01)
*H01L 21/311* (2006.01)
(Continued)

(52) U.S. Cl.
CPC . *B32B 1/00* (2013.01); *B32B 9/04* (2013.01); *B44C 1/22* (2013.01); *C23C 16/26* (2013.01);
(Continued)

(58) Field of Classification Search
None
See application file for complete search history.

(56) References Cited

U.S. PATENT DOCUMENTS 7,332,775 B2    2/2008  Steiner et al.
7,521,304 B1 *  4/2009  Huang et al. ............ 438/197
(Continued)

FOREIGN PATENT DOCUMENTS

DE    19844418 A1    4/2000
WO    2005036627 A1  4/2005

OTHER PUBLICATIONS

Air-Channel Fabrication for Micoelecomechanical Systems via Sacrificial Photosensitive Polycarbonates, J. P. Jayachandran et al.
(Continued)

*Primary Examiner* — Shamim Ahmed
*Assistant Examiner* — Bradford Gates
(74) *Attorney, Agent, or Firm* — Eschweiler & Associates, LLC

(57) ABSTRACT

A method for processing a sacrificial material of an intermediate microfabricated product includes forming a hydrogen-containing carbon layer on a surface of a base structure and releasing hydrogen from the hydrogen-containing carbon layer to obtain a hydrogen-released (i.e., densified) carbon layer with low shrink. The method further includes forming a structural layer on at least a portion of a surface of the hydrogen-released carbon layer, and oxidizing the hydrogen-released (densified) carbon layer to release the structural layer. In this manner, a cavity is formed between the base structure and the structural layer. The ashing of the hydrogen-released carbon layer leaves substantially no residues within the cavity of the intermediate or final microfabricated product. Further embodiments provide a method for manufacturing a microfabricated product, to an intermediate microfabricated product, and to a microfabrication equipment.

16 Claims, 6 Drawing Sheets

(51) Int. Cl.
- *B32B 9/04* (2006.01)
- *B44C 1/22* (2006.01)
- *C23C 16/26* (2006.01)
- *C23C 16/50* (2006.01)
- *C23C 16/56* (2006.01)

(52) U.S. Cl.
CPC ............... *C23C 16/50* (2013.01); *C23C 16/56* (2013.01); *H01L 21/31111* (2013.01); *Y10T 428/24562* (2015.01); *Y10T 428/30* (2015.01)

(56) References Cited

U.S. PATENT DOCUMENTS

| | | | |
|---|---|---|---|
| 7,687,185 B2 | 3/2010 | Zhang et al. | |
| 7,972,959 B2 | 7/2011 | Mebarki et al. | |
| 7,993,950 B2 | 8/2011 | Lacey et al. | |
| 8,110,493 B1* | 2/2012 | Subramonium et al. | 438/618 |
| 2002/0055012 A1* | 5/2002 | Chou et al. | 428/688 |
| 2006/0078677 A1* | 4/2006 | Won et al. | 427/248.1 |
| 2006/0087523 A1 | 4/2006 | Horsnell et al. | |
| 2007/0102776 A1* | 5/2007 | Pan et al. | 257/411 |
| 2007/0243721 A1 | 10/2007 | Autryve et al. | |
| 2008/0293248 A1* | 11/2008 | Park | C23C 16/26 438/694 |
| 2009/0305010 A1* | 12/2009 | Webster | B81B 3/0008 428/209 |
| 2010/0240215 A1* | 9/2010 | Huang et al. | 438/669 |
| 2010/0279451 A1* | 11/2010 | Nabki et al. | 438/51 |
| 2011/0155991 A1 | 6/2011 | Chen | |
| 2011/0156201 A1 | 6/2011 | Chen | |

OTHER PUBLICATIONS

Diamond-like amorphous carbon, J. Robertson, Materials Science and Engineering R 37 (2002) p. 129-132.

* cited by examiner

PROCESSING A SACRIFICIAL MATERIAL DURING MANUFACTURE OF A MICROFABRICATED PRODUCT

TECHNICAL FIELD

Embodiments of the present invention relate to a method for processing a sacrificial material of an intermediate microfabricated product. Further embodiments of the present invention relate to a method for manufacturing a microfabricated product. Further embodiments of the present invention relate to an intermediate microfabricated product. Further embodiments of the present invention relate to a microfabrication equipment.

BACKGROUND

For manufacturing a cavity structure in a MEMS (microelectromechanical system) or a NEMS (nanoelectromechanical system) typically one or more sacrificial layers are used for defining a cavity, such as a cavity between two membranes or between a membrane and a counter electrode. The one or more sacrificial layers are then removed again by means of etching processes during the subsequent manufacturing process. The material used for the sacrificial layer for cavity definition is, for example, deposited silicon oxide. The deposited silicon oxide is removed from the cavity in subsequent process steps in a relatively elaborate manner by means of wet chemical etching processes. When performing the chemical wet etching processes, residues (e.g., drying residues) may remain within the cavity or between the two membranes. Such residues may negatively influence the electrical and/or mechanical properties of a component with respect to its functionality (e.g., reliability problems) or lead to failure of the component.

A sacrificial layer may be subject to shrinkage occurring during process steps subsequent to the deposition of the sacrificial layer. The shrinkage of the sacrificial layer has to be taken into account when designing a MEMS or NEMS manufacturing process. The shrinkage of the sacrificial layer may even have an influence on the design of the MEMS or NEMS component and may even oblige a component designer to strike a compromise between component performance and manufacturability.

SUMMARY

Embodiments of the present invention provide a method for processing a sacrificial material of an intermediate microfabricated product. The method comprises an action of depositing a hydrogen-containing carbon layer on a surface of a base structure. According to the method, hydrogen is released from the hydrogen-containing carbon layer to obtain a hydrogen-released (i.e. densified) carbon layer. The method further comprises an action of depositing a structural layer on at least a portion of a surface of the carbon layer. Furthermore, the method comprises an oxidation of the hydrogen-released (i.e. densified) carbon layer in order to release the structural layer.

Further embodiments of the present invention provide a method for manufacturing a microfabricated product. The method comprises depositing a hydrogen-containing carbon layer on a surface of a base structure. The hydrogen-containing carbon layer serves as a sacrificial layer in the manufacturing of the microfabricated product. The method also comprises annealing the hydrogen-containing carbon layer at a temperature of at least 450° C. to obtain a hydrogen-released (i.e. densified) carbon layer. Furthermore, the method comprises depositing a structural layer on at least a portion of a surface of the carbon layer and removing the hydrogen-released (i.e. densified) carbon layer by means of a dry etching process.

Further embodiments of the present invention provide an intermediate microfabricated product comprising a base structure, a sacrificial layer and a structural layer. The sacrificial layer comprises hydrogen-containing carbon and is arranged on at least a portion of a surface of the base structure. The structural layer is arranged on at least a portion of a surface of the sacrificial layer.

Further embodiments of the present invention provide a microfabrication equipment comprising a means for depositing a hydrogen-containing carbon layer on a surface of a base structure, a means for releasing hydrogen from the hydrogen-containing carbon layer to obtain a hydrogen-released (i.e. densified) carbon layer, a means for depositing a structural layer on at least a portion of a surface of the carbon layer and a means for etching the hydrogen-released (i.e. densified) carbon layer to release the structural layer.

BRIEF DESCRIPTION OF THE DRAWINGS

Embodiments of the present invention are described herein, making reference to the appended drawings.

Equal or equivalent elements or elements with equal or equivalent functionality are denoted in the following description by equal or similar reference numerals.

DETAILED DESCRIPTION

In the following description, a plurality of details are set forth to provide a more thorough explanation of embodiments of the present invention. However, it will be apparent to one skilled in the art that embodiments of the present invention may be practiced without these specific details. In other instances, well-known structures and devices are shown in block diagram form rather than in detail in order to avoid obscuring embodiments of the present invention. In addition, features of the different embodiments described hereinafter may be combined with each other unless specifically noted otherwise.

Figure 1:
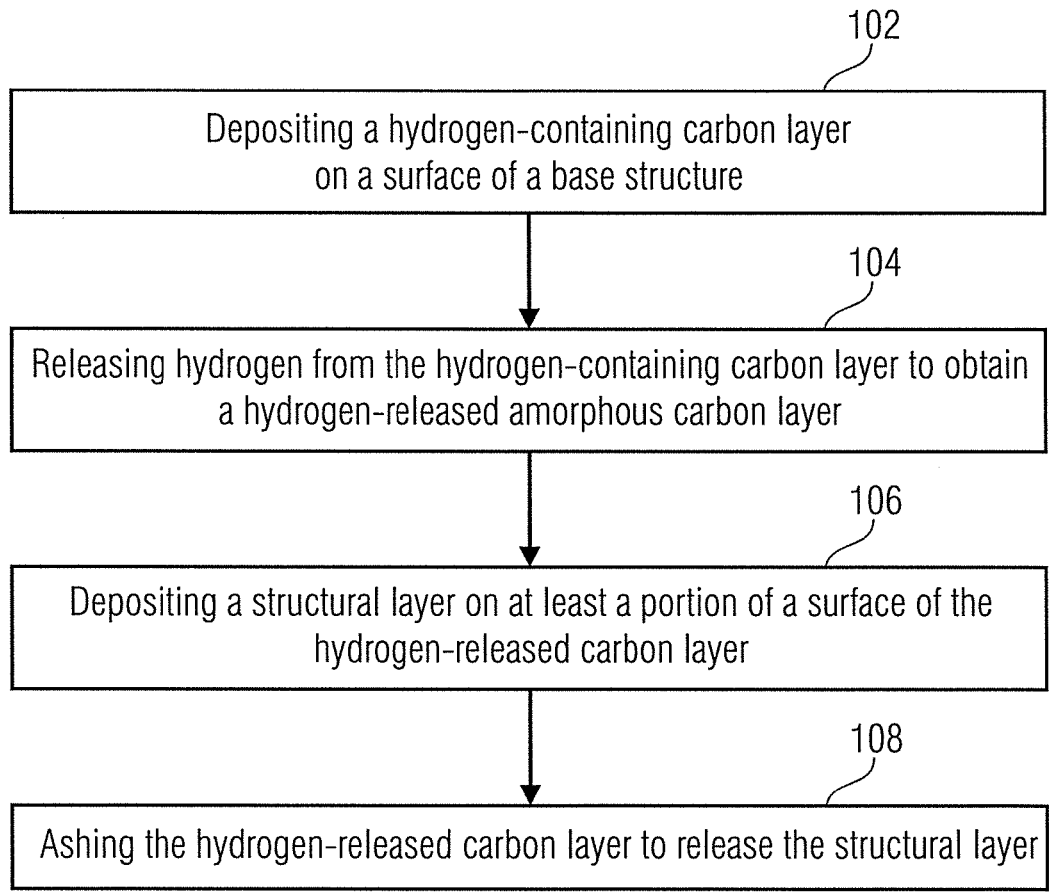
FIG. 1 shows the schematic flow diagram of a method for a sacrificial material of an intermediate microfabricated product.

FIG. 1 shows a schematic flow diagram of a method for processing a sacrificial material of an intermediate microfabricated product according to embodiments. The method starts off with a base structure which may be substantially unprocessed or, alternatively, already have undergone some preceding processing, such as CMOS processes or other processes for forming electronic, electrical, mechanical, and/or electro-mechanical components etc. within or at a surface of the base structure.

At a step or action 102 of the method, a hydrogen-containing carbon layer is deposited on a surface of the base structure. This may be achieved by means of a chemical vapor deposition (CVD) or plasma-enhanced chemical vapor deposition (PECVD). The deposition of the hydrogen-containing carbon layer may occur in a hydrocarbon atmosphere or an atmosphere with a nitrogen content. In this manner, a hydrogenated carbon layer doped with nitrogen can be obtained. A thickness of the deposited hydrogen-containing carbon layer depends on the desired dimensions of a future cavity within the intermediate microfabricated product or the final microfabricated product. For example, the thickness of the hydrogen-containing carbon layer may be between 0.5 µm and 50 µm (e.g., 1 µm, 2 µm, 3 µm, 5 µm or 8 µm). In comparison to other deposition processes, the CVD process or the PECVD process has a several times higher deposition rate so that a higher process speed can be achieved.

At least a portion of the hydrogen in the hydrogen-containing carbons layer is released to obtain a hydrogen-released i.e. densified carbon layer during a step 104 of the method for processing the sacrificial material. The hydrogen-released carbon layer may be or result in a densified carbon layer with changed structural morphology (nanocrystalline, polycrystalline etc.). The release of the hydrogen from the hydrogen-containing carbon layer may comprise an annealing process. In addition to or in the alternative, the hydrogen-containing, carbon layer may be heated to a temperature of at least 450° C. According to some embodiments of the method for processing the sacrificial material, the hydrogen-containing, carbon layer may be heated to even higher temperatures, such as 600° C., 700° C., 800° C., 900° C., 1000° C. or even more. Heating the hydrogen-containing, carbon layer to these temperatures, i.e., at least 450° C., causes a relatively strong annealing of the carbon layer which often goes along with a relatively strong shrinkage. This may be explained by the fact that matter is released from the carbon layer in the form of the released hydrogen. However, a hydrogen-containing, carbon layer that is nitrogen-doped or nitrogen-containing is capable of withstanding the required, strong annealing without noticeable shrinkage. This may be achieved by performing the deposition of the hydrogen-containing, carbon layer in a hydrocarbon-nitrogen atmosphere ($N_2$ atmosphere) in order to form a nitrogen doped carbon layer.

In summary, low shrinking and densified carbon-based films can be produced by:
1. PE-CVD with hydrogen-diluting gas added to the hydrocarbon gas (e.g. $N_2$, He, Ar etc.) and/or
2. PE-CVD at elevated temperatures (up to 1200° C.) and/or
3. PE-CVD with enhanced ion-bombardment and/or
4. PE-CVD with tuned low pressure and/or
5. Annealing after deposition (this step being typically performed after any one of the PE-CVD process varieties according to points 1. to 4. or any combination of these)

These PE-CVD process varieties (points 1. to 4. in the above list) can be combined in order to obtain a densified high temperature stable carbon material. Furthermore, the carbon to hydrogen ratio of the hydrocarbon precursor (gaseous or liquid) has a crucial impact on the properties of the resulting film.

Alternatively, the hydrogen release from step 104 could also be a pre-heating step of the deposition process of the structural layer (step or action 106).

Alternatively, the hydrogen release from step 104 could also be a post-heating step of the PE-CVD deposition process of carbon based film.

Moreover, releasing hydrogen could also be performed in a pre-annealing step before the structural layer deposition of step 106.

The release of hydrogen from the hydrogen-containing, carbon layer may condense or stabilize the carbon layer while the same is transformed to the hydrogen-released i.e. densified, carbon layer. Thus the sacrificial material substantially maintains its shape and/or dimensions during subsequent processing steps until it is removed by means of a particular process, preferably a highly selective process with respect to the sacrificial material.

In a step 106 of the method for processing the sacrificial material, a structural layer is deposited on at least a portion of a surface of the hydrogen-released, carbon layer. This deposition of the structural layer may be tailored to the properties of the structural layer, such as material, shape and thickness of the structural layer. Therefore, the deposition of the structural layer may be based on a further CVD process for depositing a material other than carbon, an oven-based deposition process, a sputtering process, etc.

The action 104 could be part of action 106. The structural layer may be deposited after the pre-heating step for hydrogen release in the deposition reactor. Subsequently, the hydrogen may be released from the hydrogen-containing, carbon layer before depositing the structural layer.

The method for processing the sacrificial material illustrated in FIG. 1 further comprises a step 108 of etching the hydrogen-released, carbon layer in order to release the structural layer. The etching of the hydrogen-released i.e. densified carbon layer may be based on at least one of an oxygen plasma etching, a hydrogen plasma etching and a combined oxygen-hydrogen plasma etching. By exposing the hydrogen-released, carbon layer to an oxygen plasma, the carbon oxidizes within the layer and forms volatile carbon monoxide (CO) and carbon dioxide ($CO_2$). By appropriate measures, adjustments to the process, and/or selection of process parameters it is possible to etch the carbon layer in a residue-free manner (without residues or contamination due to the process) so that finally a well-defined air gap is formed between the base structure and the structural layer. The oxygen plasma etching has an etching rate between 0.3 µm/min and 0.8 µm/min, typically about 0.5 µm/min. Thus, the oxygen plasma etching step is at least one order of magnitude faster than a wet chemical etching step that is commonly used with sacrificial material which are based on silicon oxide. Alternatively, other gases than oxygen may be used for etching the hydrogen-reduced carbon layer, for example, $N_2O$, hydrogen, forming gas, $CF_4$, $CF_3Br$, $CF_2Cl_2$, $Cl_2$, HCl, and $SF_6$.

In embodiments, the method for processing the sacrificial material of an intermediate microfabricated product may further comprise a pre-treatment of the surface of the base structure prior to depositing the hydrogen-containing carbon layer. Such a pre-treatment may comprise, for example, a modification of a surface roughness, a modification of a surface topology, a micro cleaning of the surface of the base structure and/or a removal of oxygen and OH groups from the surface of the base structure. Some of these measures may serve to improve an adhesion of the hydrogen-containing carbon layer or to ensure an equal layer growth of the hydrogen-containing carbon layer across the surface of the base structure. An adhesion between the base structure and the hydrogen-containing carbon layer may be increased by, for example, depositing a silicon-based intermediate layer as an adhesion promoter prior to the depositing of the hydrogen-containing carbon layer. Such a silicon-based intermediate layer may also be deposited subsequent to the depositing of the hydrogen-containing carbon layer in order to enhance an adhesion between the carbon layer and the structural layer. An enhancement of the adhesion may also be achieved by performing a significant removal of surface contaminants and chemical reduction by plasma processes.

The method for processing the sacrificial material may also comprise an action of depositing a hard mask on at least a portion of the hydrogen-containing carbon layer or the hydrogen-released carbon layer. By using the hard mask, the hydrogen-containing carbon layer or the hydrogen-released carbon layer may be structured.

In embodiments, the structural layer may comprise at least one of the following materials: silicon, metal and their nitrides and oxides.

The hydrogen content of the hydrogen-containing carbon layer may be less than 50%.

The morphology of the described carbon film can be amorphous, nanostructured (crystalline carbon clusters in an amorphous carbon matrix i.e. a nanocomposite), nanocrystalline, or polycrystalline.

Figure 2:
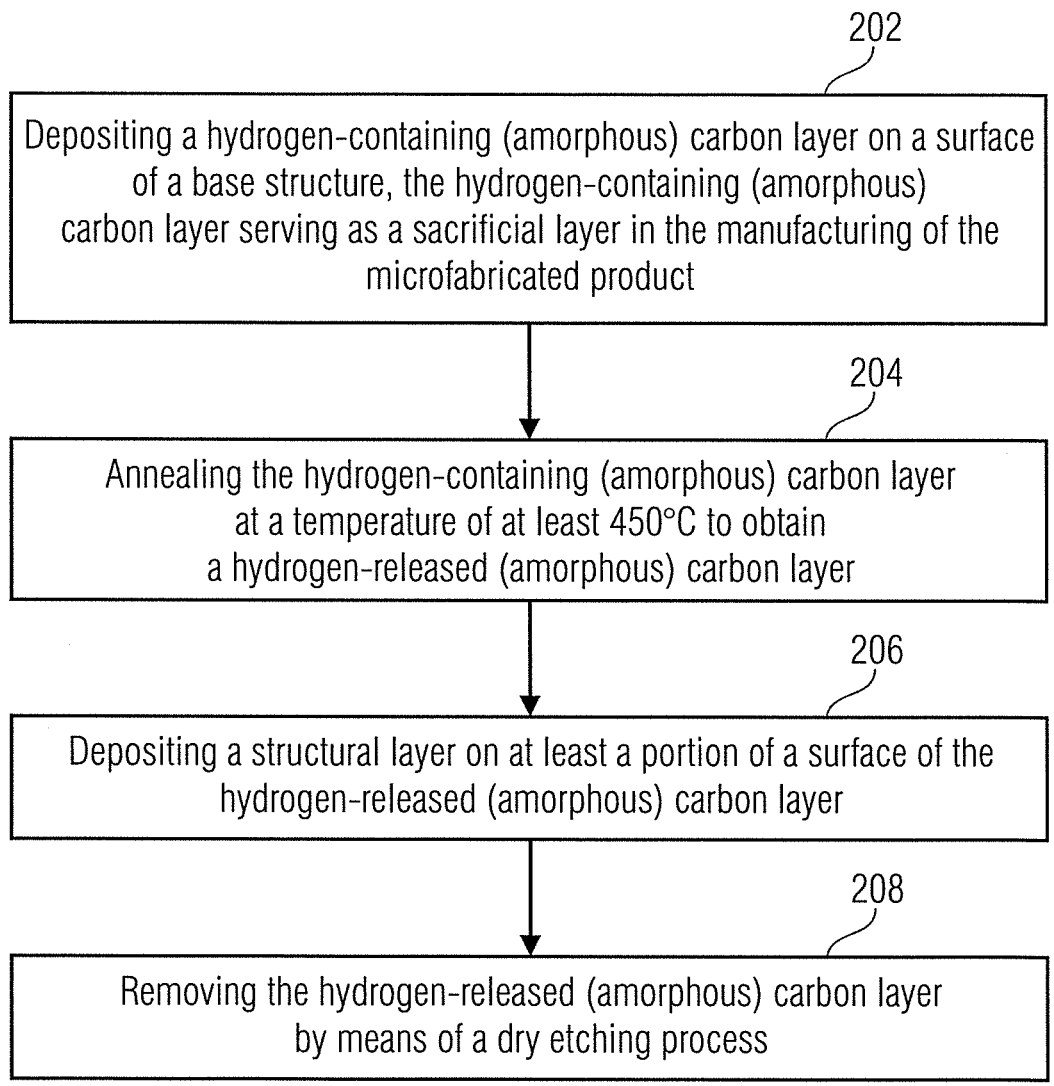
FIG. 2 shows a schematic flow diagram of a method for manufacturing a microfabricated product.

FIG. 2 shows a schematic flow diagram of a method for manufacturing a microfabricated product. A hydrogen-containing carbon layer is deposited on a surface of a base structure during a method step or action 202. The hydrogen-containing carbon layer serves as a sacrificial layer in the (subsequent) manufacturing of the microfabricated product. As mentioned above, the deposition of the hydrogen-containing carbon layer may be achieved by means of a plasma-enhanced chemical vapor deposition (PECVD). Furthermore, the depositing of the hydrogen-containing carbon layer may be performed as described above in the context of process step 102 of FIG. 1 (in particular the various PE-CVD process varieties that are discussed).

During a step 204 the hydrogen-containing carbon layer is annealed at a temperature of at least 450° C. to obtain a hydrogen-released carbon layer. In embodiments, the annealing temperature may be at least 600° C., at least 700° C., at least 800° C., at least 900° C. or at least 1000° C. The annealing stabilizes the hydrogen-released carbon layer so that it is not substantially modified or altered by subsequent method steps except for a dedicated removal step for removing the sacrificial layer. However, such strong annealing is typically only possible with special hydrogenated carbon films as described herein. Films with too low density and too high polymeric character may undergo severe damage during further densification steps like annealing for example up to 900° C. For clarity, the pre-annealing temperature has be to at least as high as a temperature attained during the subsequent micro fabrication steps.

The action 204 could be part of the action 206 described next. The structural layer may be deposited after a pre-heating step for hydrogen release in the PE-CVD deposition reactor. Releasing hydrogen may also be performed in a pre-annealing step before the structural layer deposition of step 106.

A structural layer is then deposited on at least a portion of a surface of the hydrogen-released carbon layer as indicated at step 206 in the flow diagram of FIG. 2.

During a step 208 of the flow diagram shown in FIG. 2, the hydrogen-released carbon layer is removed by means of a dry etching process. In particular, the dry etching process may comprise an oxygen plasma etching, a hydrogen plasma etching or a combined oxygen-hydrogen plasma etching.

The method for manufacturing the microfabricated product may further comprise a pre-treatment of the surface of the base structure prior to depositing the hydrogen-containing carbon layer. For example, a roughness of the base structure surface may be enhanced. As another example, a surface topology may be released. Yet a further example is a micro-cleaning of the surface of the base structure. Another option for the pre-treatment of the surface of the base structure is that oxygen and OH groups may be removed from the surface of the base structure. An enhancement of the adhesion may also be achieved by performing a significant removal of surface contaminants and chemical reduction by plasma processes. Of these various options for surface pre-treatment either none, only one, or a combination of two or more options may be performed as part of the pre-treatment of the surface of the base structure.

Another option is to deposit, e.g., a carbide forming intermediate layer (e.g., a silicon-based carbide forming intermediate layer) as an adhesion promoter prior or subsequent to the depositing of the hydrogen-containing carbon layer and possibly also subsequent to the annealing of the hydrogen-containing carbon layer.

Embodiments propose the formation of a sacrificial layer from hydrogen-containing carbon. The sacrificial layer may either be un-doped or doped with nitrogen. Thus, according to embodiments, a hydrogen-containing carbon layer is used as a sacrificial layer to define a (future) cavity of a microfabricated product. The sacrificial layer may then be removed by means of an oxygen plasma etching step and/or hydrogen plasma etching step. By etching the sacrificial layer it is ensured to a relatively high degree that no residues (e.g., residues of the sacrificial layer or drying residues) remain within the defined cavity structures. In wet etching based processes according to the prior art, residues of the wet etching step have frequently caused problems in connection with cavity microstructures and/or their manufacture.

A material that is commonly used to form a sacrificial layer is deposited silicon oxide (TEOS) which is removed from the cavity in subsequent process steps in a relatively elaborate manner by means of wet chemical etching processes. These wet etching processes may result in residues or drying residues within the cavity or between two structural layers that are intended to be separated by the cavity.

Embodiments replace, for example, silicon oxide (TEOS) as material for the sacrificial layer and, along with it, the related chemical process steps to remove the layer. A short process duration can be achieved for the depositing processes by using concepts according to embodiments (depositing rates between 0.5 and 1.0 μm/min). Furthermore, the sacrificial layer is condensed or stabilized by means of high temperature using annealing processes. The sacrificial layer has a morphology and it may be reasonably expected that this property results in an isotropic etch image for a subsequent plasma etching. The plasma etching process itself is a stable and clean process.

Embodiments make it possible to dispense with, at least as far as the processing of the sacrificial layer is concerned, the entire wet chemical processes that were formerly necessary for removing formerly used sacrificial layers. Along with dispensing with wet chemical processes, the related process problems (oxide residues and/or drying residues, so-called sticking of moveable membranes) and additional measures as required for removing such process problems (e.g., bump structures for keeping a movable layer at a distance, anti-sticking coating) are not an issue anymore when using embodiments. The final plasma etching step has a typical etch rate of about 0.5 μm/min and thus is at least one order of magnitude faster than a wet chemical etching step commonly used in connection with silicon oxide.

In summary, embodiments are related to a hydrogen containing carbon layer (doped with nitrogen or un-doped), which is prepared as a condensed sacrificial layer by means of annealing processes etc. (see description of step 104 of FIG. 1 and corresponding additional information). The carbon layer may be used in existing MEMS technology of, for example, silicon microphones for defining an air gap between a flexible membrane and a rigid counter electrode with perforation. The removal of the sacrificial layer occurs by a plasma etching with oxygen. By applying an oxygen plasma, the carbon oxidizes within the layer and forms volatile carbon monoxide (CO) and carbon dioxide ($CO_2$). The carbon layer may be an amorphous carbon layer, an amorphous carbon film, a nano-structured carbon layer or film (e.g., crystalline carbon clusters in an amorphous carbon matrix, i.e., a nanocomposite), a nanocrystalline carbon layer or film, or a polycrystalline carbon layer or film.

The hydrogen-containing carbon layer may be implemented as a sacrificial layer in a so-called silicon microphone, i.e., a microfabricated microphone comprising primarily silicon, silicon-based material and/or material compatible with a silicon-based microfabrication process. The TEOS between membrane and counter electrode used so far is replaced with the new sacrificial material according to embodiments. For example, a layer of hydrogen-containing carbon with a thickness of approximately 2 µm is deposited by means of a PECVD process. The chemical vapor deposition process features a deposition rate which is several times higher than a deposition rate of commonly used deposition processes. After the carbon layer has been deposited, the hydrogen is driven out by means of a further high temperature process at temperatures of 600° C. and higher, in order to obtain a substantially hydrogen-released layer. By driving the hydrogen out of the layer, the stability of the carbon layer is ensured during subsequent high temperature processes.

Besides an application in silicon microphones or other microfabricated sound transducers, it is also conceivable to employ the technology according to embodiments for other microfabricated products that require a sacrificial layer.

The material properties of carbon vary depending on whether the carbon contains hydrogen and, if so, on the ratio between carbon and hydrogen beneath the ratio of carbon in $sp^2$ and $sp^3$ hybridization. With respect to sacrificial layers, the physical properties of these layers can be influenced by the absence or the presence of bound hydrogen.

Various carbon layer modifications may be deposited, depending on the deposition method and the process parameters. These modifications or types of carbon may be in non-hydrogenated form or in hydrogenated form. Therefore, hydrogen-containing or hydrogenated carbon defines a subset of carbon films. According to embodiments, the deployed layers contain a hydrogen portion for manufacturing-related reasons. It is highly probable that the hydrogen is further released due to the annealing (450° C. or even higher, for example even as high as approximately 900° C.) occurring during the process. The deposition of the carbon layer with proper process tuning (see the description and additional information to step 102 of FIG. 1, in particular the various PE-CVD process varieties) appears to be one of the factors that lead to obtaining one important property of the layer for the intended application (low shrink gap filler), namely to withstand the necessary strong annealing without noticeable shrink. A low hydrogen content could also be adjusted without a nitrogen atmosphere by choosing proper PE-CVD parameters (see the description and additional information regarding step 102 in FIG. 1).

The layer properties or layer configuration prior and subsequent to the annealing may be characterized by various analysis methods.

As an example, one possible process sequence for the structuring and the annealing of the carbon layer is as follows.

1. In-situ plasma pre-treatment during an initial phase of the carbon deposition. In the alternative or in combination, an ex-situ or in-situ intermediate carbide forming layer may serve as an adhesion promoter. Subsequently, the carbon layer deposition with or without nitrogen doping occurs. It is also conceivable to deposit an in-situ carbide forming top layer as a further adhesion promoter.

2. Deposition of further layers on the carbon layer (e.g., silicon, metals, nitride, etc.). In particular, a nitride layer can be used as a hard mask for structuring the carbon layer. In connection with the nitride deposition, the carbon layer may be tempered or annealed prior to the actual nitride deposition within the nitride oven at temperatures between 600° C. to 900° C. in order to further reduce the hydrogen portion within the layer. Such further annealing occurs, according to embodiments, at significantly higher temperatures (preferably at temperatures equal to or greater than 600° C.), compared to other processes. Furthermore, an annealing of the carbon layer in an oven without layer deposition is also possible.

3. The structuring of the carbon layer is possible by means of hard masks (e.g., silicon, nitride) using an oxygen etching step, or by means of further layer depositions in order to completely build the structure and to remove the carbon layer completely later in the course of the further processing.

FIGS. 3A to 3H illustrate a plurality of intermediate stages of a method for processing a sacrificial material or a method for manufacturing a microfabricated product. Each of the FIGS. 3A to 3H shows a schematic cross-section of an intermediate microfabricated product at a particular stage of the processing and/or manufacturing.

Figure 3A:
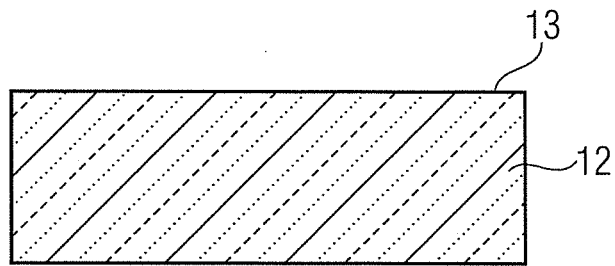
FIGS. 3A to 3H show schematic cross-sections of a structure at various stages of a method for manufacturing a microfabricated product, or of a method for processing a sacrificial material.

FIG. 3A shows a schematic cross-section of a base structure 12 having a surface 13. The main material of the base structure 12 may be, for example, an un-doped, lightly doped or strongly doped semiconductor such as silicon. Furthermore, the base structure 12 may be a bulk semiconductor or it may already have undergone some sort of previous processing for creating mechanical, electrical, electromechanical or electronic structures within the base structure 12 and/or at the surface 13.

Figure 3B:
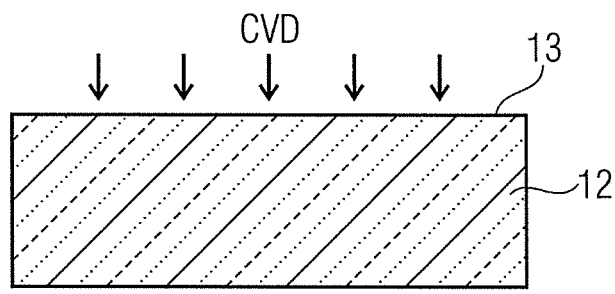
Figure 3C:
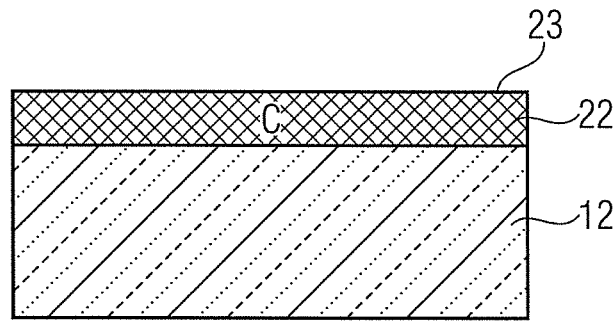

FIG. 3B shows a schematic cross-section of the base structure 12 during a chemical vapor deposition (CVD). The CVD or PECVD acts on the surface 13 of the base structure and may be performed as described above in the context of step 102 of FIG. 1. In FIG. 3C a result of the PECVD can be seen. A hydrogen-containing carbon layer 22 is arranged at the surface 13 of the base structure 12. The hydrogen-containing carbon layer 22 has a surface 23 which is opposite to the interface between the hydrogen-containing carbon layer 22 and the base structure 12. The hydrogen-containing carbon layer 22 may be nitrogen-doped or undoped. In this case, the designation of the hydrogen-containing carbon layer 22 may be nitrogen doped or undoped. The hydrogen-containing carbon layer 22 may be amorphous, nanostructured, nanocrystalline, or polycrystalline.

Figure 3D:
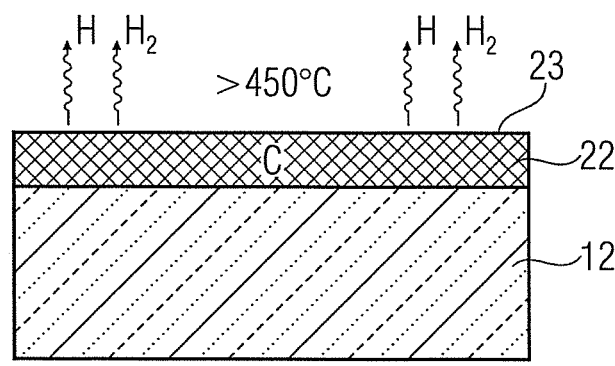

FIG. 3D illustrates a process step during which hydrogen is released from the hydrogen-containing carbon layer 22 to obtain a hydrogen-released carbon layer. The hydrogen release may be achieved by exposing the hydrogen-containing carbon layer 22 to temperatures of 450° C. and higher, preferably 600° C. and higher or even 900° C. and higher. The process step illustrated in FIG. 3D may also be regarded as an annealing step for the hydrogen-containing carbon layer 22.

Figure 3E:
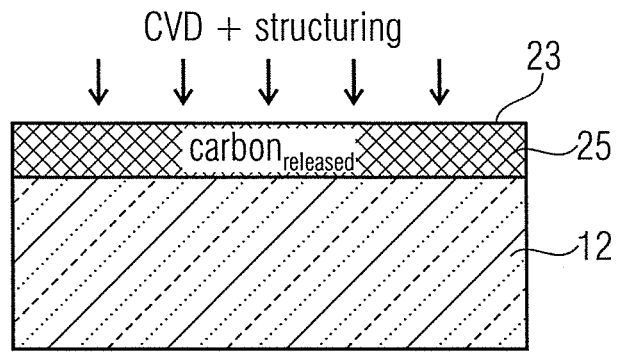

FIG. 3E shows a result of the hydrogen-release step or annealing step schematically illustrated in FIG. 3D. The hydrogen-containing carbon layer 22 from FIGS. 3C and 3D has been transformed into a hydrogen-released carbon layer 25 ($Carbon_{RELEASED}$), e.g., a densified carbon layer ($Carbon_{densified}$).

FIG. 3E also illustrates a next processing step comprising, as an example, a further CVD and a structuring process. By the further chemical vapor deposition a structural layer is deposited on at least a portion of a surface of the hydrogen-released carbon layer 25. The structuring process is used to form the structural layer according to a desired shape.

Figure 3F:
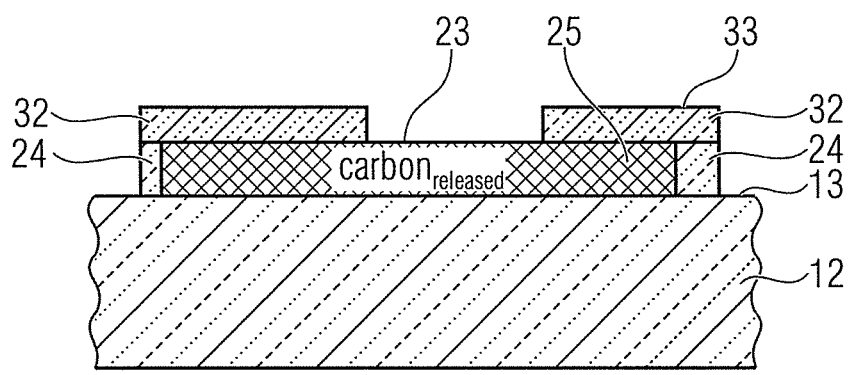

In FIG. 3F a result of the further CVD and the (optional) structuring process is illustrated. A structural layer 32 is arranged on at least a portion of a surface 23 of the hydrogen-released carbon layer 25. The structural layer 32 has itself a surface 33 opposite to an interface between the structural layer 32 and the hydrogen-released carbon layer 25. The structural layer 32 also extends beyond an edge of the hydrogen-released carbon layer 25 where it is in contact with a support structure 24. The support structure 24 is made from a material different than carbon. For example, the support structure mainly comprises silicon or silicon oxide.

Figure 3G:
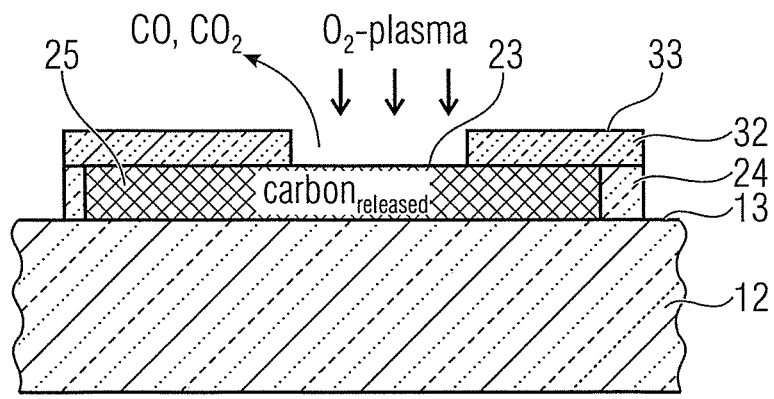

FIG. 3G illustrates an oxygen plasma etching process that is performed on the intermediate microfabricated product shown in FIG. 3F. The hydrogen-released carbon layer 25 is exposed to an oxygen plasma ($O_2$-plasma) via an opening in the structural layer 32. The oxygen plasma causes an oxidation of the hydrogen-released carbon layer 25. Reaction products of the oxidation of the hydrogen-released carbon layer 25 are carbon monoxide CO and carbon dioxide $CO_2$. These reaction products are volatile gases which leave the intermediate microfabricated product through the opening in the structural layer 32. In any event the carbon monoxide and carbon dioxide will eventually be replaced with air or a gas mixture of an atmosphere in which the final microfabricated product will be used, by diffusion processes.

Figure 3H:
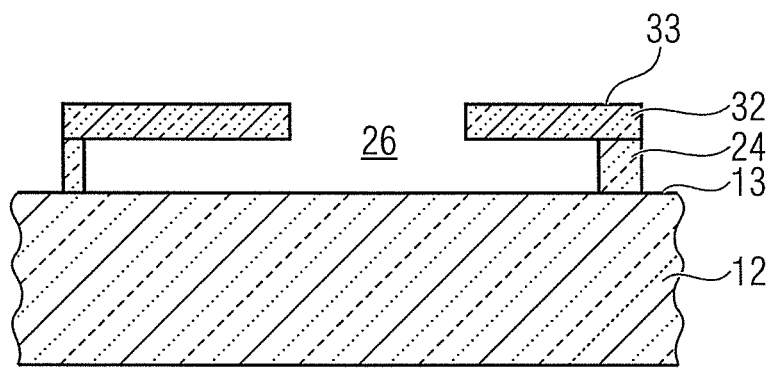

FIG. 3H shows a schematic cross-section of an intermediate microfabricated product or a final microfabricated product after the hydrogen-released carbon layer has been completely removed by means of an oxidation process. The space formerly occupied by the hydrogen-released carbon layer 25 now forms a cavity 26. The structural layer 32 may be, for example, a membrane of a sound transducer or a pressure sensor. Alternatively, the structural layer 32 may also be a beam of an inertial sensor. Other applications for a configuration comprising a structural layer 32 and a cavity 26 are also imaginable, such as electrostatic actuators or movable parts (e.g., gears rods, etc). In general, an application of embodiments is imaginable in the manufacture of processes in which a sacrificial layer is needed.

Figure 4:
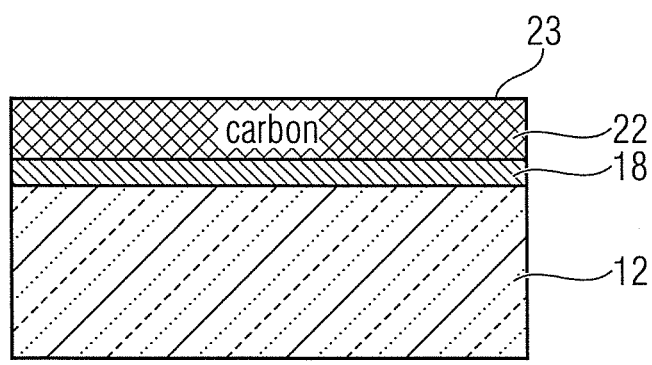
FIG. 4 shows a schematic cross-section of an intermediate product according to a further embodiment.

FIG. 4 illustrates a schematic cross-section of an intermediate microfabricated product according to (a) further possible embodiment(s). The intermediate microfabricated product shown in FIG. 4 has been obtained by first depositing a silicon-based intermediate layer 18 as an adhesion promoter prior to the depositing of the hydrogen-containing carbon layer 22. Other adhesion promoters than a silicon-based material may also be used. The silicon based intermediate layer 18 could be alternatively deposited in a pre step of the carbon deposition.

Figure 5:
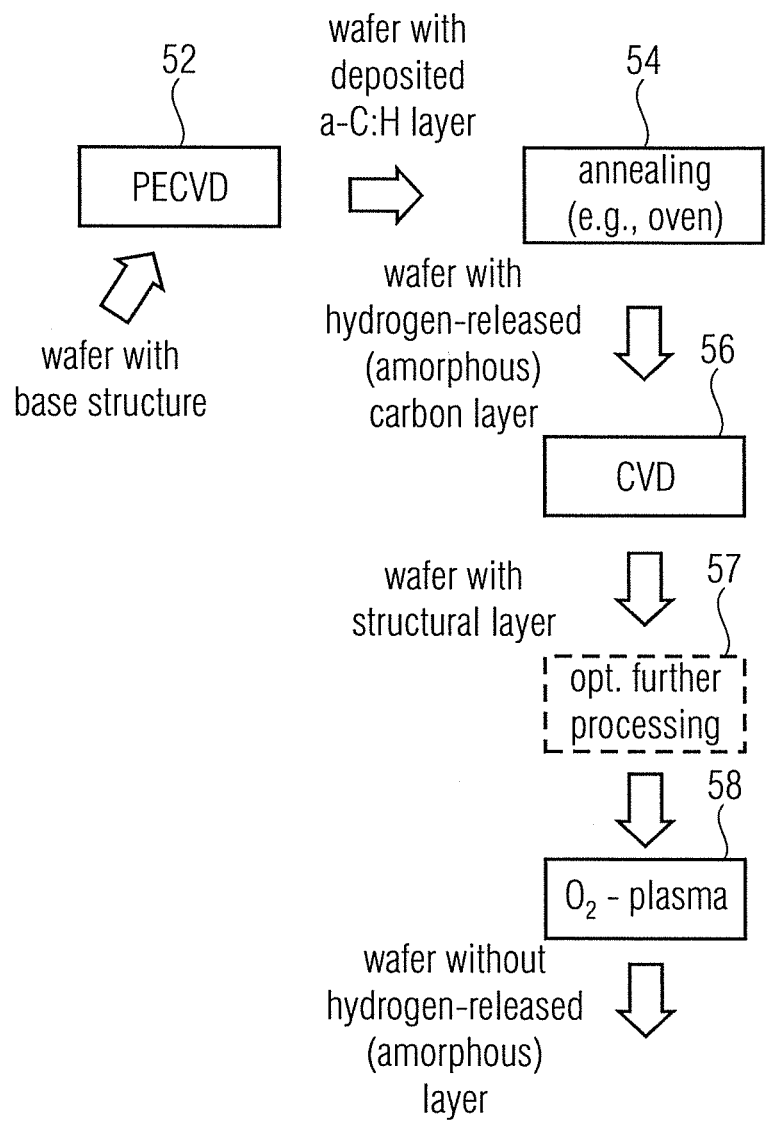
FIG. 5 schematically illustrates in block diagram form a microfabrication equipment according to embodiments.

FIG. 5 shows a schematic block diagram of a microfabrication equipment according to embodiments. The microfabrication equipment comprises a PECVD reactor 52 which receives one or more wafers comprising the base structure 12 (FIG. 3A). The PECVD reactor 52 corresponds to a means for depositing a hydrogen-containing carbon layer on a surface of a base structure. After a deposition has been performed on the wafers, the resulting wafers with the deposited hydrogen-containing carbon layer are transferred to an annealing reactor 54, such as an oven. The annealing reactor 54 is configured to heat the wafers with the deposited carbon layer to a temperature of at least 450° C. in one embodiment, and at least 600° C. to about 900° C. in one embodiment. The annealing reactor 54 corresponds to a means for releasing hydrogen from the hydrogen-containing carbon layer to obtain a hydrogen-released carbon layer.

The annealing reactor 54 produces wafers with hydrogen-released carbon layer which are transferred to a chemical vapor deposition reactor 56. The chemical vapor deposition reactor 56 serves to deposit a structural layer on the hydrogen-released carbon layer. The CVD reactor 56 corresponds to a means for depositing a structural layer on at least a portion of a surface of the hydrogen-released carbon layer. According to some embodiments, the chemical vapor deposition reactor 56 may be the same as the PE-CVD reactor 52.

The wafer with the deposited structural layer may undergo some optional further processing 57.

The hydrogen-released carbon layer is removed by means of an oxidation process which is performed by an oxygen plasma etching reactor 58. The oxygen plasma etching reactor 58 produces wafers without the hydrogen-released carbon layer, i.e., in which the structural layer has been released. The oxygen plasma etching reactor 58 corresponds to a means for oxidation the hydrogen-released carbon layer to release the structural layer.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

In the foregoing detailed description, it can be seen that various features are grouped together in embodiments for the purpose of streamlining the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus the following claims are hereby incorporated into the detailed description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective steps of these methods.

Furthermore, in some embodiments a single step may include or may be broken into multiple sub steps. Such sub steps may be included and part of the disclosure of this single step unless explicitly excluded.

What is claimed is:

1. A method for processing a sacrificial material of an intermediate microfabricated product, the method comprising:
    forming a hydrogen-containing and nitrogen-containing carbon layer as the sacrificial material on a surface of a base structure, wherein the forming occurs in a hydrocarbon-nitrogen atmosphere;
    forming a structural layer on at least a portion of a surface of the hydrogen-containing and nitrogen-containing carbon layer, wherein the structural layer is a flexible membrane; and
    oxidizing the hydrogen-containing and nitrogen-containing carbon layer to release the structural layer to define an air gap between the flexible membrane and the base structure.

2. The method according to claim 1, wherein forming the hydrogen-containing and nitrogen-containing carbon layer comprises forming by at least one of:
    a chemical vapor deposition,
    a plasma-enhanced chemical vapor deposition,
    a plasma-enhanced chemical vapor deposition with hydrogen-diluting gas added to a hydrocarbon gas used for the plasma-enhanced chemical vapor deposition,
    a plasma-enhanced chemical vapor deposition at elevated temperatures up to 1200 degrees Celsius,
    a plasma-enhanced chemical vapor deposition with enhanced ion-bombardment, plasma-enhanced chemical vapor deposition with tuned low pressure, and annealing after deposition.

3. The method according to claim 1, wherein the forming the hydrogen-containing and nitrogen-containing carbon layer is performed by depositing the hydrogen-containing and nitrogen-containing carbon layer in the hydrocarbon-nitrogen atmosphere.

4. The method according to claim 1, wherein the hydrogen-containing and nitrogen-containing carbon layer is nitrogen-doped.

5. The method according to claim 1, wherein oxidizing the hydrogen-released carbon layer comprises performing at least one of an oxygen plasma etching, a hydrogen plasma etching, and a combined oxygen-hydrogen plasma etching.

6. The method according to claim 1, further comprising pre-treating the surface of the base structure prior to depositing the hydrogen-containing and nitrogen-containing carbon layer, wherein pre-treating comprises at least one of: modifying a surface roughness of the base structure, modifying a surface topology of the base structure, microcleaning the surface of the base structure, performing a plasma treatment, and removing oxygen and OH groups from the surface of the base structure.

7. The method according to claim 1, further comprising forming a carbide forming intermediate layer as an adhesion promoter prior or subsequent to the depositing of the hydrogen-containing and nitrogen-containing carbon layer.

8. The method according to claim 1, further comprising:
    forming a hard mask on at least a portion of the hydrogen-containing and nitrogen-containing carbon layer; and
    patterning the hydrogen-containing and nitrogen-containing carbon layer using the hard mask.

9. The method according to claim 1, wherein the structural layer comprises at least one of silicon, metal, and nitride.

10. The method according to claim 1, wherein the hydrogen-containing and nitrogen-containing carbon layer has a hydrogen content of less than or equal to 50%.

11. A method for manufacturing a microfabricated product, the method comprising:
    forming a hydrogen-containing and nitrogen-containing carbon layer on a surface of a base structure, the hydrogen-containing and nitrogen-containing carbon layer serving as a sacrificial layer in the manufacturing of the microfabricated product, wherein the forming occurs in a hydrocarbon-nitrogen atmosphere, and wherein the microfabricated product is an electromechanical transducer, wherein the base structure comprises a counter electrode of the electromechanical transducer and wherein the hydrogen-content of the hydrogen-containing and nitrogen-containing carbon layer is less than 50%;
    forming a structural layer on at least a portion of a surface of the hydrogen-containing and nitrogen-containing carbon layer, wherein the structural layer is a flexible membrane; and
    removing the hydrogen-containing and nitrogen-containing carbon layer by means of a dry etching process to define an air gap between the flexible membrane and the counter electrode.

12. The method according to claim 11, wherein forming the hydrogen-containing and nitrogen-containing carbon layer comprises performing a chemical vapor deposition or a plasma-enhanced chemical vapor deposition.

13. The method according to claim 11, wherein forming the hydrogen-containing and nitrogen-containing carbon layer is performed by depositing the hydrogen-containing and nitrogen-containing carbon layer in the hydrocarbon-nitrogen atmosphere.

14. The method according to claim 11, wherein the hydrogen-containing and nitrogen-containing carbon layer is nitrogen-doped.

15. The method according to claim 11, further comprising pre-treating the surface of the base structure prior to depositing the hydrogen-containing and nitrogen-containing carbon layer, wherein the pre-treating comprises at least one of modifying a surface roughness of the base structure, modifying a surface topology of the base structure, microcleaning the surface of the base structure, and removing oxygen and OH groups from the surface of the base structure.

16. The method according to claim 11, further comprising depositing a silicon-based intermediate layer as an adhesion promoter prior or subsequent to the depositing of the hydrogen-containing and nitrogen-containing carbon layer.

* * * * *